Figure 1:
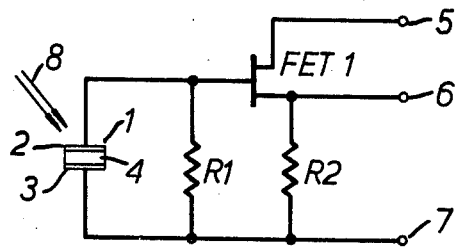

United States Patent [19]

Porter et al.

[11] 4,110,616

[45] Aug. 29, 1978

[54] PYROELECTRIC DETECTORS

[75] Inventors: Stephen George Porter, Towcester; David Appleby, Northampton, both of England

[73] Assignee: Plessey Handel und Investments A.G., Zug, Switzerland

[21] Appl. No.: 759,478

[22] Filed: Jan. 14, 1977

[30] Foreign Application Priority Data

Jan. 16, 1976 [GB] United Kingdom ............... 01681/76

[51] Int. Cl.² .............................................. G01J 5/20
[52] U.S. Cl. .................................. 250/338; 250/332; 250/370
[58] Field of Search ........................ 250/338, 332, 370

[56] References Cited

U.S. PATENT DOCUMENTS

| | | | |
|---|---|---|---|
| 3,539,803 | 11/1970 | Beerman | 250/338 |
| 3,846,820 | 11/1974 | Lampe et al. | 250/338 X |
| 3,919,555 | 11/1975 | Singer | 250/332 |
| 3,985,685 | 10/1976 | Houlton et al. | 250/338 X |

*Primary Examiner*—Archie R. Borchelt
*Attorney, Agent, or Firm*—Fleit & Jacobson

[57] ABSTRACT

A pyroelectric detector which includes at least one pyroelectric element consisting of a pyroelectric material sandwiched between first and second electrodes, and a semiconductor chip having a field effect transistor formed on one surface thereof and having an electrical contact for the gate electrode of the transistor formed on the surface thereof, opposite to said one surface, the gate electrode contact of the chip being secured in electrical contact to the first one of the electrodes of the pyroelectric element, the size of the chip being such that a major portion of the first electrode is not covered by the chip.

24 Claims, 6 Drawing Figures

PYROELECTRIC DETECTORS

The invention relates to pyroelectric detectors.

The invention provides a pyroelectric detector which includes at least one pyroelectric element consisting of a pyroelectric material sandwiched between first and second electrodes; and a semiconductor chip having a field effect transistor formed on one surface thereof and having an electrical contact for the gate electrode of the transistor formed on the surface thereof opposite to said one surface, the gate electrode contact of the chip being secured in electrical contact to the first one of the electrodes of the pyroelectric element, the size of the chip being such that a major portion of the first electrode is not covered by the chip. An electrically conductive member of relatively low thermal conductivity secured to and in electrical contact with the second of the electrodes of the pyroelectric element, the shape of the member being such that a major portion of the first electrode is not covered by the said member. That one of the electrodes of the pyroelectric element which is exposed to the infra-red radiation being detected, can be of either a heat absorbing material such as platinum black or a material such as a nickel/chromium alloy which is transparent to infra-red radiation, and the other one of the electrodes could, for example, be of gold formed on a nickel/chromium alloy. The securing of the pyroelectric element to the chip and the electrically conductive member can be effected with a silver loaded epoxy based resin.

According to a feature of the invention a pyroelectric detector as outlined in the preceding paragraph is provided which also includes an enclosure member for the detector on one wall of which the electrically conductive member is secured; first resistance means having one side thereof connected to first electrical supply terminal means and the other side thereof connected to output terminal means, the source electrode of the field effect transistor being connected to the output terminal means; second resistance means having one side thereof connected to the first terminal means and the other side thereof connected to the gate electrode of the field effect transistor; and second electrical supply terminal means connected to the drain electrode of the field effect transistor. The first and second resistance means can each be provided by a resistor chip and be secured to the said one wall of the enclosure member. Alternatively, the second resistance means can be provided by the conductivity properties of the pyroelectric element. The said one wall of the enclosure member can be either electrically conductive and thereby provide the first electrical supply terminal means or transparent to infrared radiation and thereby provide a window for the detector or both. The output terminal means and the second electrical supply terminal means can each be provided by an electrically conductive rod which passes through, and is electrically insulated from, the said one wall of the enclosure member.

According to another feature of the invention a pyroelectric detector as outlined in the preceding paragraphs is provided which includes an array of pyroelectric elements.

Figure 2:
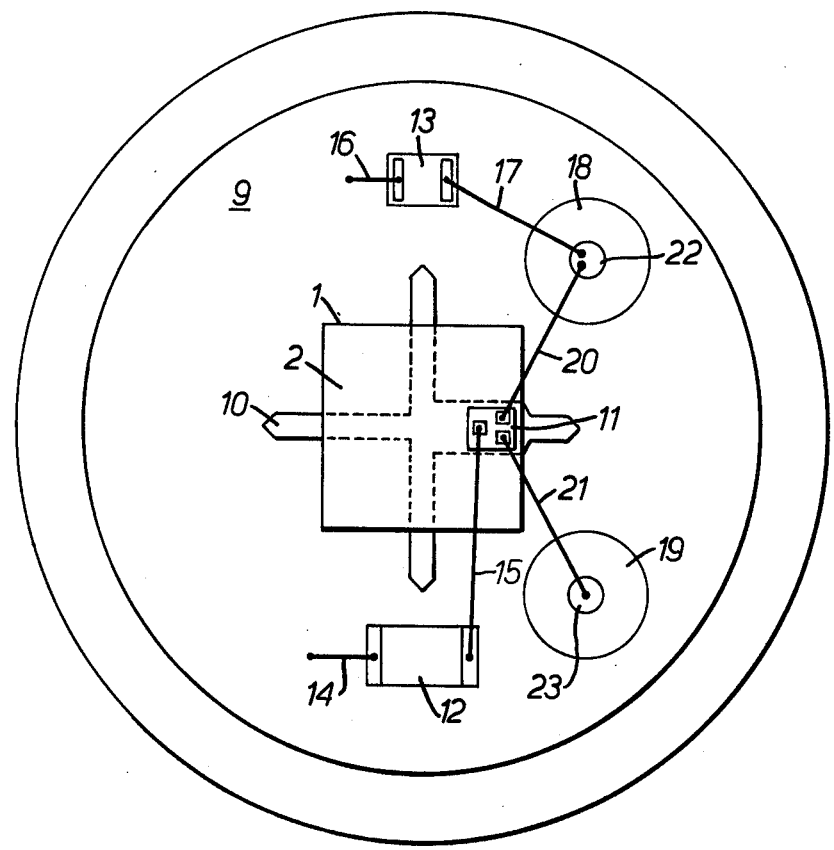
Figure 3A:
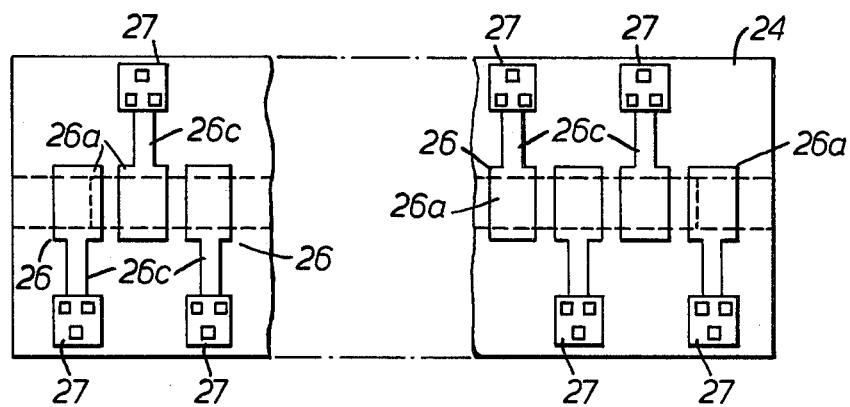
Figure 3B:
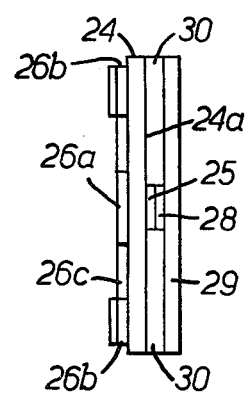
Figure 4A:
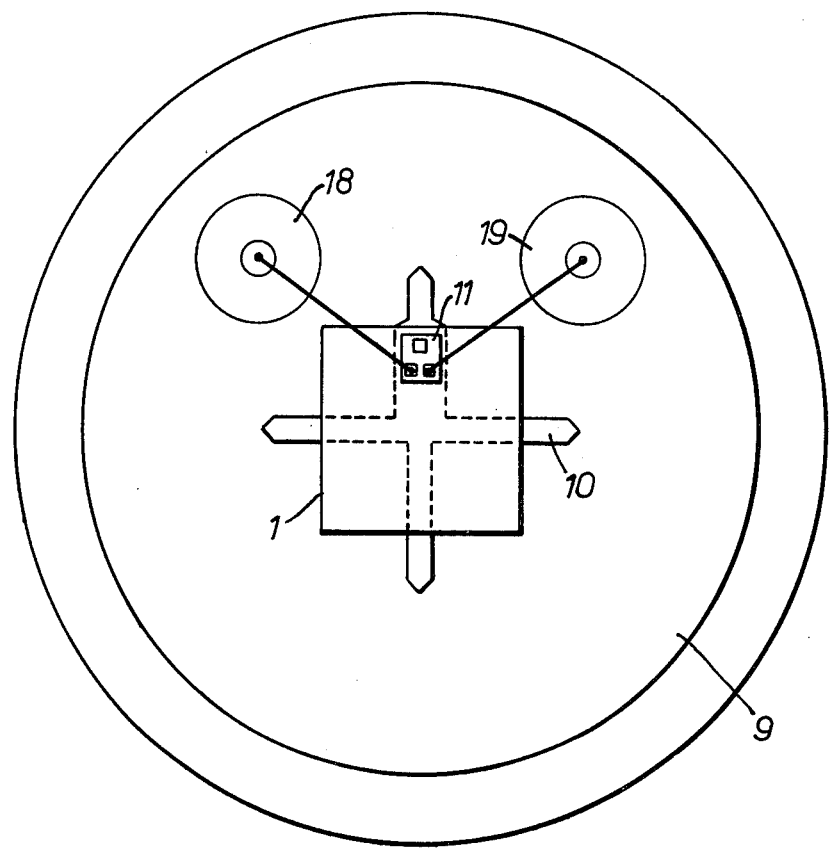
Figure 4B:
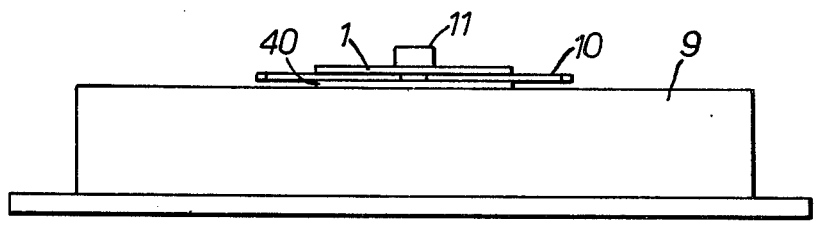

The foregoing and other features according to the invention will be better understood from the following description with reference to the accompanying drawings, in which:

FIG. 1 shows the circuit diagram of a pyroelectric detector,

FIG. 2 diagrammatically illustrates in a plan view, one arrangement for a pyroelectric detector according to the invention, and FIGS. 3(A) and (B) diagrammatically illustrate respectively in a plan view and an end elevation, part of another arrangement for a pyroelectric detector according to the invention, FIG. 4(A) shows a plan view of a further embodiment of the present invention and FIG. 4(B) shows a sectional view of the embodiment of FIG. 4(A).

The circuit diagram of a pyroelectric detector is shown in FIG. 1 of the drawings and includes a pyroelectric element 1 consisting of a pyroelectric material 4 sandwiched between two electrodes 2 and 3. The electrode 2 is connected to the gate electrode of a field effect transistor FET 1 and the electrode 3 is connected to an electrical supply terminal 7 which is in practice connected to earth potential.

A resistance R1 is connected between the gate electrode of the transistor FET 1 and the terminal 7, and the source of the transistor FET 1 is connected to an output terminal 6 and to the terminal 7 via a resistance R2. The drain electrode of the transistor FET 1 is connected to an electrical supply terminal 5 which is in practice connected to a positive D.C. voltage source.

In operation, infra-red radiation 8 falling on the pyroelectric element 1 heats the pyroelectric material 4 and causes a charge to be produced on opposite faces of the material 4. The variation in charge resulting from the modulated infra-red radiation is picked off by the electrodes 2 and 3 and applied as an A.C. voltage signal to the gate electrode of the transistor FET 1 which amplifies the signal to provide an output signal across the terminals 6 and 7 representative of the infra-red radiation.

In a pyroelectric detector according to the present invention, one of the electrodes 2, 3 of the pyroelectric element 1 of FIG. 1 is mounted on, and secured in electrical contact with, an electrically conductive substrate of relatively low thermal conductivity. The substrate is mounted in an enclosure member, on one wall thereof, and is of a shape which is such that it does not cover a major portion of the electrode to which it is secured and thereby effectively thermally isolates the pyroelectric element 1 from the wall of the enclosure member on which it is mounted. The structure is, however, arranged so that the pyroelectric element 1 is sufficiently rigidly mounted in order to minimise microphonic effects.

In practice, the pyroelectric element 1 could be mounted in a conventional transistor can. With this arrangement the pyroelectric element 1 would, as is diagrammatically illustrated in FIG. 2 of the drawings in a plan view, be mounted on an electrically conductive header 9 of the transistor can with an electrically conductive substrate 10 situated between the header 9 and the pyroelectric element 1.

The substrate 10 which can be, for example, of stainless steel or glass, is in the shape of a cross and, therefore, a major portion of the electrode 3 to which the substrate is secured is not covered by the substrate. The pyroelectric element 1 is, therefore, rigidly mounted on, and thermally isolated from, the header 9.

The transistor FET 1 of FIG. 1 is in the form of a semiconductor chip in the pyroelectric detector according to the present invention. The chip structure is such that the field effect transistor is formed on one surface thereof and an electrical contact for the gate electrode of the field effect transistor is formed on that surface of the chip which is opposite to the said one surface thereof.

The gate electrode contact of the chip 11 is, as is illustrated in FIG. 2 of the drawings, secured in electrical contact to the electrode 2 of the pyroelectric element over the supporting area of the underlying substrate 10. The size of the chip 11 is such that a major portion of the radiation sensing electrode 2 is left uncovered.

This structure eliminates (a) a separate wire connection from the gate of the transistor FET 1 to the pyroelectric element 1 thereby effecting a reduction in the stray capacitance associated with the gate connection, and (b) a separate wire connection from the pyroelectric element to the header 9.

The radiation sensing electrode of the pyroelectric element 1 i.e. the electrode 2 of FIG. 2, can be of either a heat absorbing material such as platinum black or a material such as a nickel/chromium alloy which is transparent to infra-red radiation, and the other electrode could, for example, be of a gold formed on a nickel/chromium alloy.

The securing of the pyroelectric element to the semiconductor chip and the electrically conductive substrate and the securing of the substrate to the wall of the enclosure member in which it is mounted can be effected with a silver loaded epoxy based resin. The construction of the detector is simplified with this structure because the substrate, pyroelectric element and semiconductor chip can be handled at the same point by an epoxy bonding machine.

The resistance R1 and R2 can each be provided by a resistor chip and be secured to the wall of the enclosure member to which the pyroelectric element is secured.

With the arrangement of FIG. 2, the resistance R1 is provided by a conventional thick film resistor chip 12 and the resistance R2 is provided by a conventional thin film resistor chip 13. Both of the resistor chips 12 and 13 are secured to the header 9 by means of the substrates on which the resistance elements are formed. One end of the chip 12 is connected to the header 9 by means of a connecting lead 14 whilst the other end thereof is connected to the gate electrode of the FET chip 11 by means of a connecting lead 15. One end of the chip 13 is connected to the header 9 by means of a connecting lead 16 whilst the other end thereof is connected, by means of a connecting lead 17, to an electrically conductive rod 22 which passes through, and is electrically insulated from, the header 9 and which constitutes the terminal 6 of the circuit of FIG. 1.

Alternatively, the resistance R1 could be provided by the conductivity properties of the pyroelectric element 1 thereby eliminating the provision of a separate biassing resistance for the transistor FET 1 and the associated interconnecting leads, for example, the resistor chip 12 and the connecting leads 14 and 15 of FIG. 1, reducing the complexity and cost of the detector and increasing the reliability of the detector.

Preferred pyroelectric materials which possess the requisite conductivities for this function are uranium substituted lead zirconate titanate ceramics, or uranium substituted lead zirconate iron niobate ceramics, or either of these ceramics with further substitutions of other elements such as, for example, bismuth, potassium, lanthanum, manganese, and tantalum, examples of which appear in our co-pending United Kingdom patent application No. 35315/74. Alternatively, oxide ferroelectrics, for example, lead germanate ceramic or single crystal, or suitably modified lithium tantalate, could be used for the pyroelectric material 4 of the pyroelectric element 1 of FIGS. 1 and 2.

With this arrangement, the transistor FET 1 can be suitably biassed over a wide temperature range without significantly reducing the leakage resistance of the transistor at room temperature if the conducting pyroelectric material used in the pyroelectric element has a suitable temperature coefficient of resistivity which approximately matches that of the temperature coefficient of the gate leakage current of the transistor FET 1. Examples of pyroelectric materials of this type are the uranium substituted ceramics referred to in the preceding paragraph.

The source electrode of the FET chip 11 is connected to the rod 22 by means of a connecting lead 20 and the drain electrode of the FET chip 11 is connected by means of a connecting lead 21, to an electrically conductive rod 23 which passes through, and is electrically insulated from, the header 9 and which constitutes the terminal 5 of the circuit of FIG. 1. The terminal 7 of the circuit of FIG. 1 is provided by the header 9.

In practice, the securing of the connecting leads to the various components could be effected with an ultrasonic wire bonder.

In an alternative arrangement for the pyroelectric detector according to the present invention, the wall of the enclosure member to which the pyroelectric element is secured by means of the electrically conductive substrate could provide a window for the detector and would, therefore, have to be of a material which is transparent to infra-red radiation. The FET chip would, therefore, with this arrangement be shielded from the infra-red radiation and the radiation sensing electrode would be that electrode which is secured to the electrically conductive substrate. A major portion of the radiation sensing electrode of this arrangement would not, as previously stated be covered by the substrate and the sensitivity of the detector would not be greatly reduced.

Whilst the pyroelectric detectors outlined in preceding paragraphs include single element devices, the pyroelectric detectors according to the present invention can include an array of pyroelectric elements and associated components mounted and arranged in a manner as previously outlined. A typical arrangement for an array of pyroelectric elements is diagrammatically illustrated in FIGS. 3(A) and (B) of the drawings respectively in a plan view and an end elevation, and includes a pyroelectric member 24 having a strip electrode 25 formed on one surface thereof and a number of electrodes 26 formed on the other surface thereof. The enlarged section 26a of each of the electrodes 26 and the underlying sections of the pyroelectric member 24 and of the electrode 25 constitute separate pyroelectric elements.

A semiconductor chip 27 of a field effect transistor is provided for each of the pyroelectric elements and is mounted in the manner outlined in a preceding paragraph on another enlarged region 26b of the associated one of the electrodes 26. Alternate ones of the chips 27 are mounted on opposite sides of the row of pyroelectric elements and the regions 26a and b of each electrode 26 are connected together by means of a strip member 26c.

The array of pyroelectric elements would in practice be mounted within an enclosure member and secured in a manner as specified in a preceding paragraph to one wall thereof by means of the electrode 25 and an electrically conductive substrate in the form of two strip members 28 formed on a ceramic substrate 29 which would be secured to the said one wall of the enclosure member, the strip members 28 being secured to and in electrical contact with a separate one of the ends of the electrode 25. In practice, the space between the surface 24a of the member 24 and the substrate 29 would be filled with an adhesive 30 such as an epoxy based resin.

The resistance R1 and R2 of FIG. 1 would be provided for each of the pyroelectric elements and could be in any of the forms outlined in preceding paragraphs in relation to FIGS. 1 and 2 of the drawings.

It should be noted that the connecting leads 14 and 16 for the resistor chips 12 and 13 of FIG. 2 could be eliminated by providing a contact for the said one end of the resistors on that surface thereof which is secured to the header 9.

With reference to FIGS. 4(A) and 4(B) a second pyroelectric element 40 can be included which is positioned adjacent to the first pyroelectric element 1, such that the substrate 10 is sandwiched between the two pyroelectric elements. Both elements are substantially identical in configuration, and they are of opposite polarity.

Due to the substantially identical configuration of the pyroelectric elements, 1 and 40 when radiation falls on the first pyroelectric element 1, the second pyroelectric element 40 will receive no radiation; thus a normal pyroelectric signal will be produced.

In the case of ambient temperature changes and vibrations both elements are effected equally, however, due to their opposite polarity these effects will be cancelled and the signals produced will be equal and opposite.

For use at low frequencies i.e. below 20Hz the two pyroelectric elements must be isolated thermally by the use of an intervening substrate 10 which in a preferred embodiment is made from stainless steel. For use at higher frequencies i.e. above 20Hz better compensation for microphony and ambient temperature change may be achieved by omitting the substrate and securing the two superimposed pyroelectric elements together with suitable means for example epoxy based resin.

What is claimed is:

1. A pyroelectric detector which includes at least one pyroelectric element consisting of a pyroelectric material sandwiched between first and second electrodes, and a semiconductor chip having a field effect transistor formed on one surface thereof and having an electrical contact for the gate electrode of the transistor formed on the surface thereof, opposite to said one surface, the gate electrode contact of the chip being mechanically secured to and in electrical contact with the first one of the electrodes of the pyroelectric element, the size of the chip being such that a portion of the first electrode is not covered by the chip.

2. A pyroelectric detector as claimed in claim 1 including an electrically conductive member of relatively low thermal conductivity which is secured to and in electrical contact with the second of the electrodes of the pyroelectric element, the shape of the member being such that a major portion of the first electrode is not covered by the said member.

3. A pyroelectric detector as claimed in claim 1 wherein the first of the electrodes of the pyroelectric element comprises gold formed on a nickel chromium alloy coated with a radiation absorbing material such as platinum black.

4. A pyroelectric detector as claimed in claim 1 wherein the first electrode is constructed from a material such as a nickel chromium alloy which is transparent to infrared radiation.

5. A pyroelectric detector as claimed in claim 1 wherein the second electrode of the pyroelectric element is constructed from gold formed on a nickel chromium alloy.

6. A pyroelectric detector as claimed in claim 2 wherein the electrically conductive member of relatively low thermal conductivity is constructed from stainless steel.

7. A pyroelectric detector as claimed in claim 2 wherein the means of securing the pyroelectric element to the chip and the electrically conductive member is effected by a silver loaded epoxy based resin.

8. A pyroelectric detector as claimed in claim 2 including an enclosure member on one wall of which the electrically conductive member is secured, said wall being electrically conductive and providing a first electrical supply terminal means, first two terminal resistance means having one terminal thereof connected to the first electrical supply terminal means, the source electrode of the field effect transistor being connected to an output terminal means; second two terminal resistance means having one terminal thereof connected to the first terminal means and the other thereof connected to the gate electrode of the field effect transistor, and a second electrical supply terminal means connected to the drain electrode of the field effect transistor.

9. A pyroelectric detector as claimed in claim 8 wherein the first and second two terminal resistance means are each provided by a resistance chip.

10. A pyroelectric detector as claimed in claim 9 wherein the first and second two terminal resistance means are each mechanically secured to the said one wall of the enclosure member.

11. A pyroelectric detector as claimed in claim 1 wherein a resistance means is provided by the conductive properties of the pyroelectric element.

12. A pyroelectric detector as claimed in claim 11 wherein the pyroelectric material of the pyroelectric element is selected from a group which includes: uranium substituted lead zirconate titanate ceramics, uranium substituted lead zirconate iron niobate ceramics.

13. A pyroelectric detector as claimed in claim 12 wherein the pyroelectric material is further substituted with bismuth, potassium, lanthanum, manganese and tantalum.

14. A pyroelectric detector as claimed in claim 8 wherein said one wall of the enclosure member is transparent to infra-red radiation thereby providing a window.

15. A pyroelectric detector as claimed in claim 8 wherein the output terminal means and the second electrical supply terminal means can each be provided by an electrically conductive rod which passes through, and is electrically insulated from said one wall of the enclosure member.

16. A pyroelectric detector as claimed in claim 2 wherein a second pyroelectric element, of substantially identical configuration to the first said pyroelectric element and of opposite polarity thereto is positioned directly adjacent to said first pyroelectric element in a manner whereby the electrically conductive member is sandwiched between the first and second pyroelectric elements.

17. A pyroelectric detector as claimed in claim 1 wherein said detector comprises an array of pyroelectric detectors.

18. An array of pyroelectric detectors as claimed in claim 17 wherein the pyroelectric detectors are arranged in a straight line.

19. An array of pyroelectric detectors as claimed in claim 17 wherein each pyroelectric detector in said array comprises said pyroelectric element sandwiched between said first and second electrodes and in which said gate electrode of the FET transistor is connected to an extended portion of the first electrode.

20. An array of pyroelectric detectors as claimed in claim 19 wherein the sandwiches of said pyroelectric elements and said first and second electrodes are mounted in a straight line and wherein the FET transistors of successive pyroelectric detectors in said array are arranged on opposite sides of the straight line.

21. A pyroelectric detector as claimed in claim 1 including an enclosure member on one wall of which the first electrode is secured, said wall being electrically conductive and providing a first electrical supply terminal means, first two terminal resistance means having one terminal thereof connected to the first electrical supply terminal means, the source electrode of the field effect transistor being connected to an output terminal means; second two terminal resistance means having one terminal thereof connected to the first terminal means and the other connected to the gate electrode of the field effect transistor and a second electrical supply terminal means connected to the drain electrode of the field effect transistor.

22. A pyroelectric detector as claimed in claim 21 wherein the first and second two terminal resistance means are each provided by a resistance chip.

23. A pyroelectric detector as claimed in claim 22 wherein the first and second two terminal resistance means are each mechanically secured to the said one wall of the enclosure member.

24. A pyroelectric detector as claimed in claim 1 wherein a second pyroelectric element of substantially identical configuration to the first said pyroelectric element of opposite polarity thereto is positioned directly adjacent to said first pyroelectric element in a manner whereby the first electrodes are sandwiched between the first and second pyroelectric elements.

* * * * *